(12) United States Patent
Schlapbach et al.

(10) Patent No.: US 7,671,639 B2
(45) Date of Patent: Mar. 2, 2010

(54) ELECTRONIC CIRCUIT

(75) Inventors: Ulrich Schlapbach, Liebefeld (CH);
Raffael Schnell, Seon (CH)

(73) Assignee: ABB Technology AG, Zurich (CH)

( * ) Notice: Subject to any disclaimer, the term of this patent is extended or adjusted under 35 U.S.C. 154(b) by 1139 days.

(21) Appl. No.: 10/557,408

(22) PCT Filed: May 18, 2004

(86) PCT No.: PCT/CH2004/000301
§ 371 (c)(1),
(2), (4) Date: Nov. 18, 2005

(87) PCT Pub. No.: WO2004/102806
PCT Pub. Date: Nov. 25, 2004

(65) Prior Publication Data
US 2006/0226708 A1    Oct. 12, 2006

(30) Foreign Application Priority Data
May 19, 2003    (EP)    ................................. 03405343

(51) Int. Cl.
*H03K 3/00*    (2006.01)
*H03B 1/00*    (2006.01)
(52) U.S. Cl. .................. 327/110; 327/389; 327/391; 327/434; 327/436
(58) Field of Classification Search .............. None
See application file for complete search history.

(56) References Cited

U.S. PATENT DOCUMENTS

| | | | | |
|---|---|---|---|---|
| 4,567,379 A | * | 1/1986 | Corey et al. | 327/108 |
| 4,758,941 A | * | 7/1988 | Felton et al. | 363/132 |
| 4,983,865 A | * | 1/1991 | Ho et al. | 327/404 |
| 5,134,321 A | * | 7/1992 | Mehta | 327/404 |
| 5,166,541 A | | 11/1992 | Mori | |
| 5,276,357 A | * | 1/1994 | Cripe | 327/109 |

FOREIGN PATENT DOCUMENTS

| DE | 101 52 879 A1 | 5/2003 |
|---|---|---|
| JP | 62230358 A | 10/1987 |

\* cited by examiner

*Primary Examiner*—Tuan Lam
(74) *Attorney, Agent, or Firm*—Buchanan Ingersoll & Rooney PC

(57) ABSTRACT

In the case of an electronic circuit, comprising a drive unit, which generates at least one drive signal, two or more power semiconductor switches each having a first and a second main terminal, which power semiconductor switches can be switched synchronously by the drive signal, the first and the second main terminals of the power semiconductor switches in each case being electrically connected in parallel among one another, for each of the power semiconductor switches a first and a second electrically conductive connection for connection to the drive unit, a uniform dynamic current division between the power semiconductor switches is achieved according to the invention by virtue of the fact that a first inductance is provided in each of the first electrically conductive connections, and a second inductance is provided in each of the second electrically conductive connections, the first inductance being coupled to the second inductance for each of the power semiconductor switches.

7 Claims, 4 Drawing Sheets

ELECTRONIC CIRCUIT

This disclosure is based upon European Application No. 03405343.9, filed May 19, 2003, and International Application No. PCT/CH2004/000301, filed May 18, 2004, the contents of which are incorporated herein by reference.

TECHNICAL FIELD

The present invention is concerned with the field of power electronics. It relates to an electronic circuit and a power semiconductor module.

PRIOR ART

In conventional power semiconductor modules, two or more, generally identical, power semiconductor switches are often connected in parallel in order to achieve a desired total current capacity. In this case; it must be ensured that a total current flowing through the power semiconductor module at any point in time is distributed as uniformly as possible between the individual power semiconductor switches in order to prevent a current capacity of an individual power semiconductor switch from being exceeded. Switching operations, in particular, are critical in this context since during these operations a feedback from output sides to driving sides of the power semiconductor switches may lead to a nonuniform dynamic current division. This is explained below with reference to FIG. 1. FIG. 1 shows a circuit diagram of a power semiconductor module having three power semiconductor switches connected in parallel according to the prior art, which is produced for example in the case of an asymmetrical layout of three insulated gate bipolar transistors (IGBT) $T_1$, $T_2$ and $T_3$. In this case, parasitic emitter-side inductances $L_{E,1}$, $L_{E,2}$ and $L_{E,3}$ have different values on account of different geometries of corresponding electrically conductive connections between the respective emitter terminal $E_1$, $E_2$ or $E_3$ and a node C. During a switching operation, different voltages are induced across the inductances $L_{E,1}$, $L_{E,2}$ and $L_{E,3}$ on account of the different values of said inductances. In the present case where $L_{E,1}=L_{E,3}>L_{E,2}$, this results in a dynamic circulating current, that is to say a current flow from emitter terminal $E_1$ or $E_3$ to emitter terminal $E_2$, as is illustrated by broken arrows in FIG. 1. This current flow in turn generates different voltage drops $U_{R,1}$, $U_{R,2}$ and $U_{R,3}$ across emitter resistances $R_{E,1}$, $R_{E,2}$ and $R_{E,3}$ and thus different gate voltages $U_{G,1}$, $U_{G,2}$ and $U_{G,3}$ at the IGBTs $T_1$, $T_2$, and $T_3$. The different gate voltages $U_{G,1}$, $U_{G,2}$ and $U_{G,3}$ finally effect oscillations, circulating currents and the abovementioned nonuniform dynamic current division, which leads to a reduction of a switching capacity relative to a theoretically possible value ("derating").

Various methods are known which enable this nonuniform dynamic current division to be counteracted.

Firstly, separate driving in conjunction with output-side decoupling by means of additional inductive or resistive components, by means of which the different values of the inductances $L_{E,1}$, $L_{E,2}$ and $L_{E,3}$ are compensated for, is taken into consideration. However, such a solution leads to an increased space requirement, also to increased costs in the case of large currents on account of requirements made of the components.

It is also conceivable in each case to effect a hard, direct connection both of the output sides and of the driving sides, the driving sides preferably being decoupled by means of decoupling resistances. If a steady-state as well as dynamic symmetry can be achieved, this is a useful and cost-effective solution. However, since this generally necessitates in particular a geometrical symmetry of the power semiconductor modules or at least a mutually identical or mirror-inverted embodiment of driving and power leads, such a procedure generally cannot be employed, or at most can be employed with a high outlay, in the case of power semiconductor modules having more than two power semiconductor switches. Moreover, the solution described generally cannot be employed if power semiconductor switches situated in separate submodules or even complete power semiconductor modules are intended to be connected in parallel.

A further variant likewise uses the hard, direct connection of the output sides but decouples the driving sides by using separate drive units. However, this imposes stringent requirements with regard to synchronicity and affinity of the drive units, which in turn leads to increased production costs.

SUMMARY OF THE INVENTION

Consequently, it is an object of the invention to specify an electronic circuit having at least two power semiconductor switches connected in parallel, in the case of which a dynamic current division between the at least two power semiconductor switches which is as uniform as possible is achieved.

These and further objects are achieved by means of an electronic circuit of the type described herein.

In the case of the electronic circuit according to the invention, in particular for use as a power switch, provision is made of a drive unit, which generates at least one drive signal, and two or more power semiconductor switches each having a first and a second main terminal, which power semiconductor switches can be switched synchronously by the drive signal, the first and the second main terminals of the power semiconductor switches in each case being electrically connected in parallel among one another. For each of the power semiconductor switches a first and a second electrically conductive connection for connection to the drive unit are provided, a first inductance being provided in each of the first electrically conductive connections and a second inductance being provided in each of the second electrically conductive connections, and the first inductance being coupled to the second inductance for each of the power semiconductor switches. According to the invention, a respective common-mode rejection inductor is provided in each pair of first and second electrically conductive connections, that is to say that a respective common-mode rejection inductor is provided for each of the power semiconductor switches. Here, in each case a first winding of the common-mode rejection inductors forms the first inductance and a second winding of the common-mode rejection inductors forms the second inductance.

The coupled inductances reduce coupling and crosstalk problems during switching operations. Dynamic circulating currents are minimized and oscillations between the power semiconductor switches are effectively suppressed. The electronic circuit according to the invention has both the advantages of output sides that are directly connected in parallel and the advantages of separate driving of the power semiconductor switches, without necessitating synchronization of a plurality of separate control units or costly circuitry in the output circuit, which enables cost-effective production. A balancing of the output sides can be optimized for a direct-current behavior, in particular by means of a uniform division of a gate resistance between gate and emitter of the power semiconductor switches. The common-mode rejection inductors decouple the pairs of first and second electrically conductive connections from the power circuit which runs through the power semiconductor switches between cathode terminals and a common node of the power semiconductor switches.

The decoupling furthermore ensures a uniform dynamic current division between corresponding paths in the power circuit.

These and further objects, advantages and features of the invention will become apparent from the following detailed description of a preferred exemplary embodiment of the invention in conjunction with the drawing.

Figure 1:
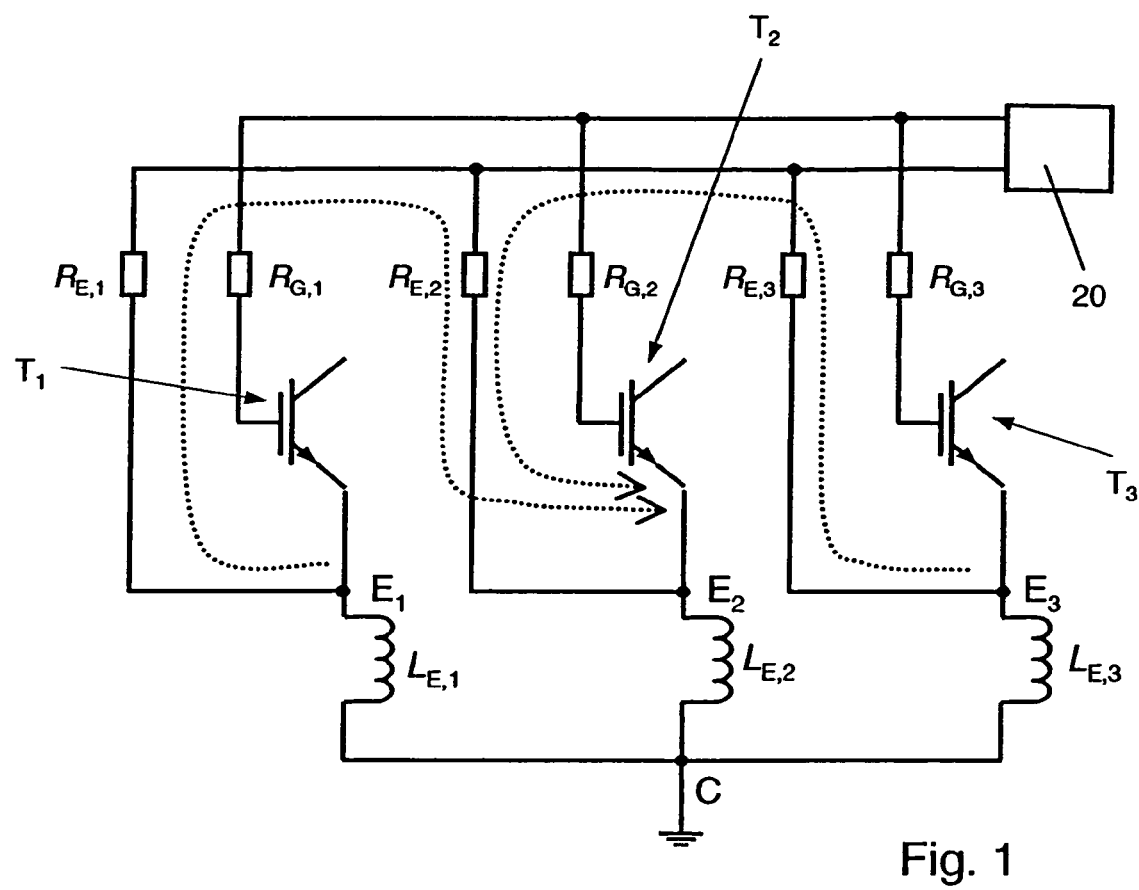
FIG. 1 shows an electronic circuit having three power semiconductor switches connected in parallel according to the prior art.

The reference symbols used in the drawing and their meanings are summarized in the List of reference symbols. In principle, identical parts are provided with identical reference symbols in the figures. The embodiments described represent the subject matter of the invention by way of example and do not have a restrictive effect.

Ways of Embodying the Invention

Figure 2:
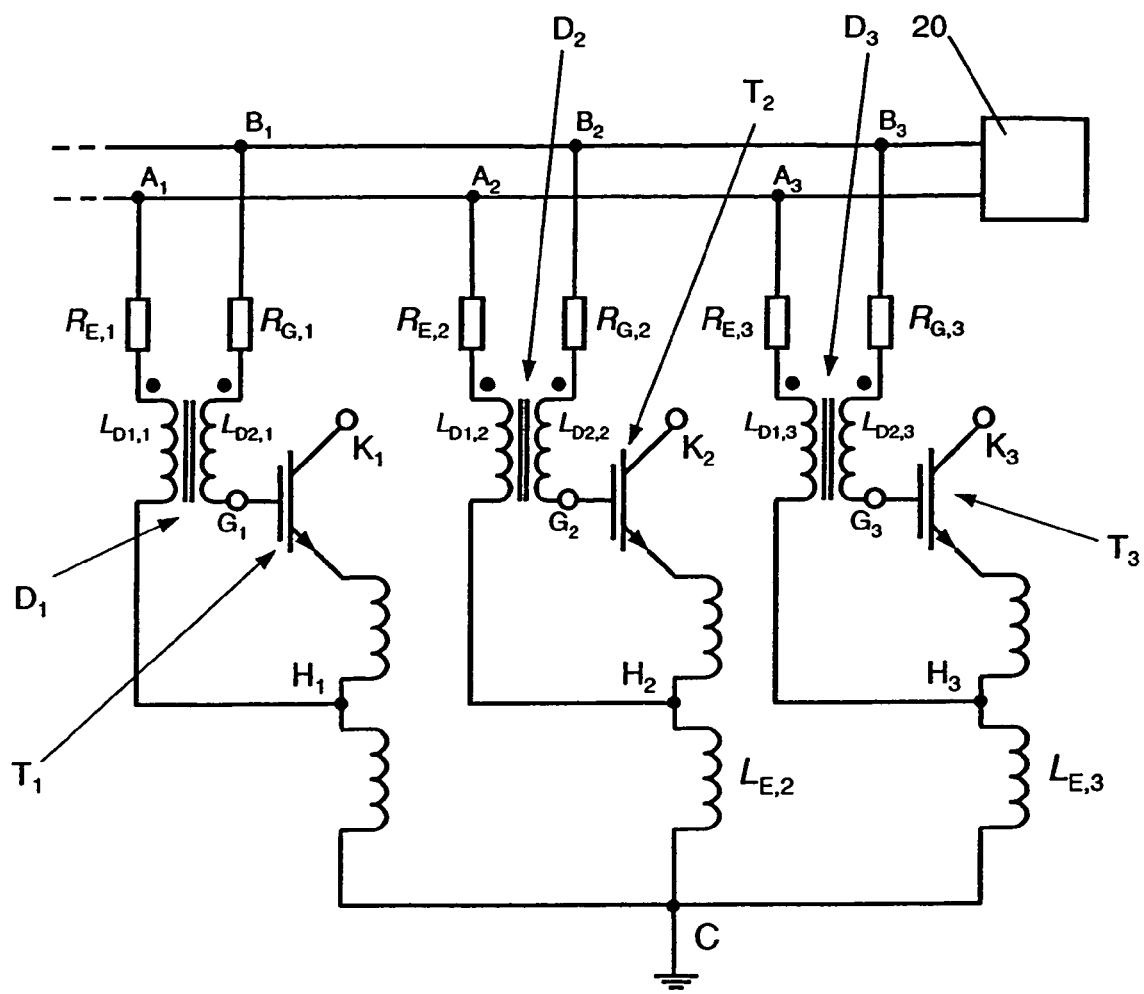
FIG. 2 shows an electronic circuit according to the invention.

FIG. 2 shows an electronic circuit according to the invention having three IGBTs $T_i$, where $i \in \{1,2,3\}$, connected in parallel as power semiconductor switches. The latter can be switched synchronously by means of a common drive unit 20. For this purpose, a drive signal generated by the common drive unit 20 can be fed to each of the IGBTs $T_i$ via a respective pair of driving leads. However, it is also conceivable for the synchronously switchable power semiconductor switches $T_i$ to be unipolar insulated gate field effect transistors (MOSFET). In accordance with FIG. 2, each pair of driving leads comprises a first driving lead, which is provided between node $A_i$ and auxiliary emitter terminal $H_i$, and a second driving lead, which is provided between node $B_i$ and gate terminal $G_i$. According to the invention, a respective common-mode reduction inductor $D_i$ is provided in each pair of first and second electrically conductive connections (pairs of driving leads), that is to say that a respective common-mode rejection inductor $D_i$ is provided for each of the power semiconductor switches $T_i$. In accordance with FIG. 2, here in each case a first winding of the common-mode rejection inductor $D_i$ forms the first inductance $L_{D1,i}$ and a second winding of the common-mode rejection inductor $D_i$ forms the second inductance $L_{D2,i}$.

The common-mode rejection inductors $D_i$ decouple the pairs of driving leads, that is to say the pairs of first and second electrically conductive connections, from a power circuit that runs through the IGBTs $T_i$ between cathode terminals $K_i$ and a common node C. The decoupling ensures a uniform dynamic current division between paths $K_1$-C, $K_2$-C and $K_3$-C in the power circuit. In this case, a gate resistance is preferably divided such that for $i \in \{1,2,3\}$ $R_{G,i} \approx R_{E,i}$ holds true, where a value of half the nominal gate resistance $R_{G,nom}$ of the IGBT is preferably chosen for $R_{G,i}$ and $R_{E,i}$, that is to say $R_{G,i} = R_{E,i} = \frac{1}{2} R_{G,nom}$.

Figure 3A:
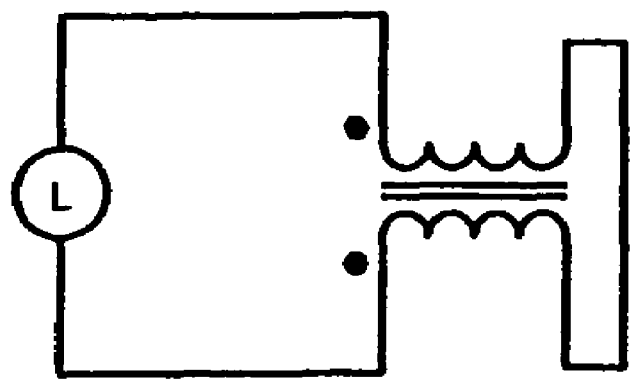
FIG. 3a shows a circuit diagram of a measuring arrangement for measuring a series inductance of a common-mode rejection inductor $D_i$.

In this case, series inductances $L_{D,i}^{(G)}$ of the common-mode rejection inductors $D_i$ are preferably chosen to be as small as possible, preferably less than or equal to 200 nH. In this case, the series inductance of the common-mode rejection inductor $D_i$ is that inductance which is measured if both turns of the common-mode rejection inductor $D_i$ are connected in series. FIG. 3a shows a circuit diagram of a measuring arrangement for measuring the series inductance of the common-mode rejection inductor $D_i$.

In this case, common-mode inductances $L_{D,i}^{(G)}$ of the common-mode rejection inductors $D_i$ are preferably chosen at least approximately as follows: on the basis of a maximum $\Delta L_E$ of the differences $L_{E,i} - L_{E,j}$ between two emitter inductances where $i \neq j \in \{1,2,3\}$ and a predetermined maximum permissible difference $\Delta U_{GE}$ between two gate-emitter voltages $U_{GE,i}$ and $U_{GE,j}$ which are present between auxiliary emitter terminals $H_i$ and $H_j$, respectively, and gate terminals $G_i$ and $G_j$, respectively, of two IGBTs $T_i$ and $T_j$, respectively, where $i \neq j \in \{1,2,3\}$, it is possible to calculate a minimum common-mode inductance $L_D^{(G)}$. Since the IGBTs $T_i$ are voltage-controlled components in which a collector current can be set by way of the gate-emitter voltage $U_{GE,i}$, it is necessary to read out the maximum permissible voltage difference $\Delta U_{GE}$ by way of a maximum permissible collector current difference in a region of interest from a transfer characteristic of the IGBTs $T_i$.

A permissible difference in a gate charge $\Delta Q_{GE}$ is produced by multiplying the maximum permissible voltage difference $\Delta U_{GE}$ by a gate-emitter capacitance $C_{GE}$ in accordance with $\Delta Q_{GE} = \Delta U_{GE} \cdot C_{GE}$, it having been assumed that the gate-emitter capacitance $C_{GE,i}$ has the same value $C_{GE}$ for all three IGBTs $T_i$.

A maximum permissible difference $\Delta I_G$ between gate currents $I_i$ and $I_j$ where $i \neq j \in \{1,2,3\}$ can then be calculated by dividing the maximum permissible difference in the gate charge $\Delta Q_{GE}$ by a relevant time $t_R$ during which the voltage builds up across the various emitter inductances, that is to say $$\Delta I_G = \frac{\Delta Q_{GE}}{t_R}.$$

For the minimum common-mode inductance $L_D^{(G)}$, the following thus results if a voltage-time integral over the difference in the emitter inductances is divided by the permissible gate current difference:

$$L_D^{(G)} = \frac{U}{\Delta I_G / \Delta t} = \frac{U \cdot \Delta t}{\Delta I_G}$$

The voltage-time integral over the maximum $\Delta L_E$ of the differences in the emitter inductances $L_{E,i} - L_{E,j}$ can be calculated by multiplying $\Delta L_E$ by a maximum current, the short-circuit current $I_{SC}$ of the IGBTs:

$U \cdot \Delta t = \Delta L_E \cdot I_{SC}$.

Consequently, the following results:

$$L_D^{(G)} = \frac{U}{\Delta I_G / \Delta t} = \frac{\Delta L_E \cdot I_{SC}}{\Delta I_G}$$

Figure 3B:
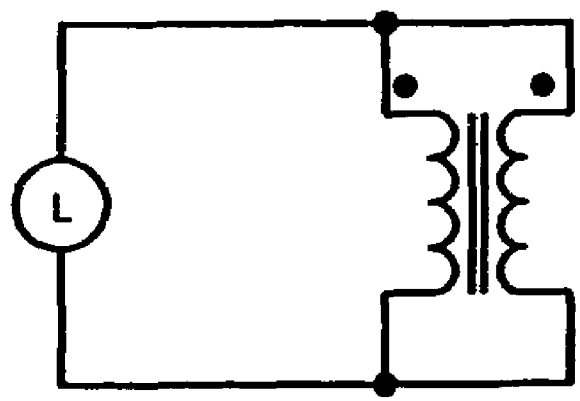
FIG. 3b shows a circuit diagram of a measuring arrangement for measuring a common-mode inductance of a common-mode rejection inductor $D_i$.

In this case, the common-mode inductance of the common-mode rejection inductors $D_i$ is that inductance which is measured if both turns of the common-mode rejection inductor $D_i$ are connected in parallel. FIG. 3b shows a circuit diagram of a measuring arrangement for measuring the common-mode inductance of the common-mode rejection inductor $D_i$.

Figure 4:
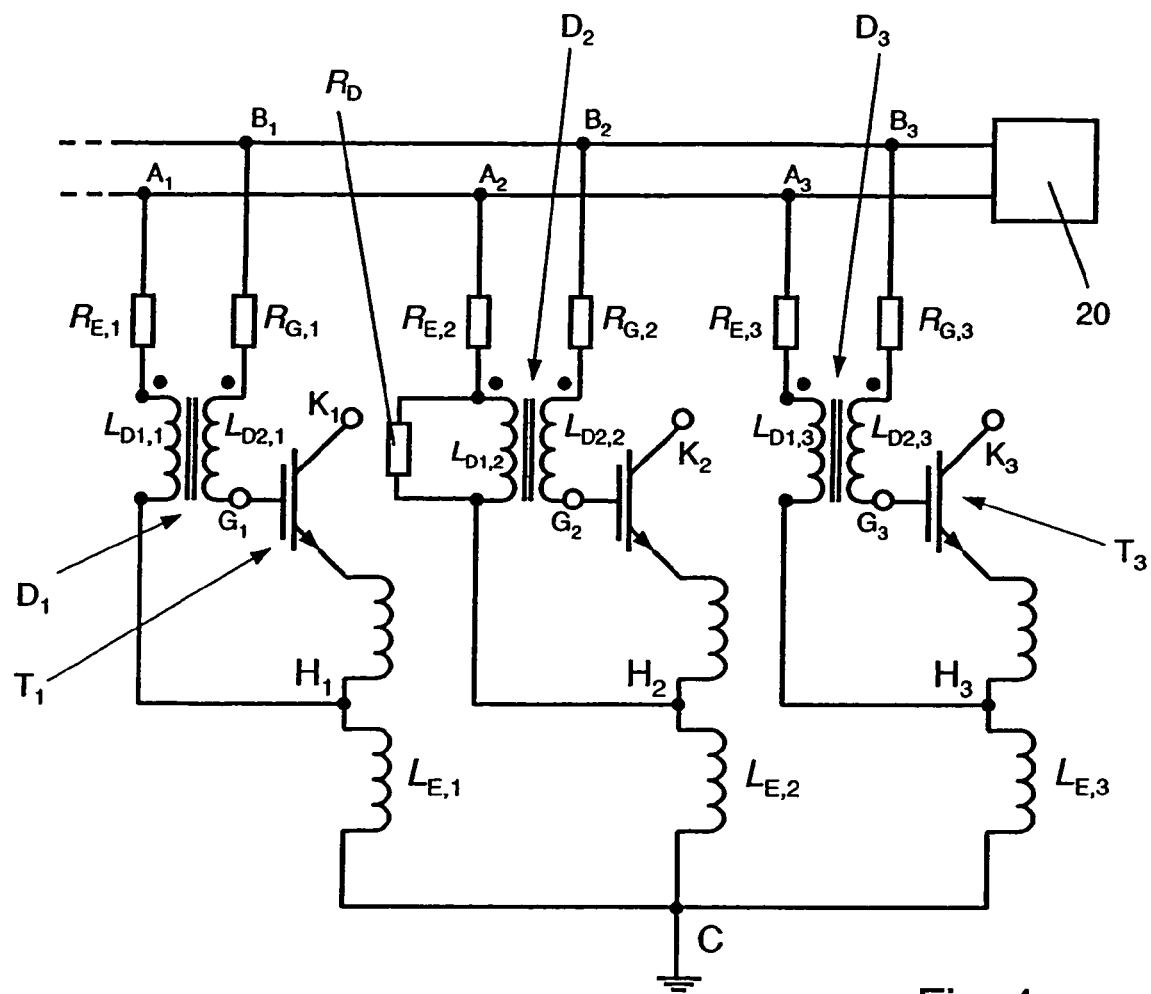
FIG. 4 shows a preferred configuration of an electronic circuit according to the invention.

FIG. 4 shows a preferred configuration of the electronic circuit according to the invention. In this case, a resistor $R_D$ is provided between the node $A_2$ and the auxiliary emitter terminals $H_2$ in parallel with the common-mode rejection inductor $D_2$ in order to minimize peak values $\hat{U}_D$ between the drive unit 20 and the power circuit. A value of a few ohms to a few tens of ohms is preferably chosen for $R_D$.

A power semiconductor module according to the invention comprises a module housing of a type known per se and an electronic circuit according to the invention such as has been described in this section. In this case, both the power semiconductor switches and the drive unit 20 and/or the first and second inductances are preferably accommodated in the module housing. However, the drive unit 20 and/or the first and second inductances may advantageously also be provided outside the module housing, in particular be screwed on or plugged on.

In a preferred development of the power semiconductor module according to the invention, this module comprises two or more submodules, and the at least two power semiconductor switches driven by the control unit are not all situated in the same submodule. In this case, the invention can be used particularly advantageously since a mutually identical or mirror-inverted embodiment of driving and power leads generally cannot be realized in power semiconductor switches situated in different submodules and, consequently, known makeshift solutions described in the prior art are not available.

LIST OF REFERENCE SYMBOLS

20 Drive unit
$A_1, A_2, A_3$ Node
$B_1, B_2, B_3$ Node
$D_1, D_2, D_3$ Common-mode rejection inductor
$E_1, E_2, E_3$ Emitter terminal
$G_1, G_2, G_3$ Gate terminal
$H_1, H_2, H_3$ Auxiliary emitter terminal
$K_1, K_2, K_3$ Cathode terminal
$L_{D1,1}, L_{D1,2}, L_{D1,3}$ First inductance
$L_{D1,1}, L_{D2,2}, L_{D2,3}$ Second inductance
$R_D$ Limiting resistor
$T_1, T_2, T_3$ IGBT, power semiconductor switch

The invention claimed is:

1. An electronic circuit comprising a drive unit, which generates at least one drive signal, two or more power semiconductor switches each having a first and a second main terminal, which power semiconductor switches are synchronously switchable switched synchronously by the drive signal, the first and the second main terminals of the power semiconductor switches in each case being electrically connected in parallel among one another, for each of the power semiconductor switches a first and a second electrically conductive connection for connection to the drive unit, a first inductance in each of the first electrically conductive connections, a second inductance in each of the second electrically conductive connections, the first inductance being coupled to the second inductance for each of the power semiconductor switches wherein a respective common-mode rejection inductor is provided for each of the power semiconductor switches, in each case a first winding of the common-mode rejection inductor forming the second inductance and in that for each common-mode rejection inductor a common-mode inductance $L_{D,i}^{(G)}$ is chosen which is greater than a minimum common-mode inductance $L_D^{(G)}$ where $$L_D^{(G)} = \frac{\Delta L_E \cdot I_{SC}}{\Delta I_G},$$

where $\Delta L_E$ is a maximum difference $L_{E,i}-L_{E,j}$ between two emitter inductance $L_{E,i}$ and $L_{E,j}$ where $i \neq j \in \{1,2,3\}$, $I_{SC}$ is a short-circuit current of the power semiconductor switches and $\Delta I_G$ is a maximum permissible difference $I_i-I_j$ between two gate currents $I_i$ and $I_j$, where $i \neq j \in \{1,2,3\}$.

2. The electronic circuit as claimed in claim 1, wherein the synchronously switchable power semiconductor switches are insulated gate bipolar transistors.

3. The electronic circuit as claimed in claim 1, wherein the synchronously switchable power semiconductor switches are unipolar insulated gate field effect transistors.

4. The electronic circuit as claims in claim 2, wherein the first electrically conductive connection for each of the insulated gate bipolar transistors makes contact with an auxiliary emitter terminal and a limiting resistor is provided in parallel with one of the first inductances.

5. A power semiconductor module, comprising a module housing, wherein the power semiconductor module comprises an electronic circuit as claimed in claim 1.

6. The power semiconductor module as claimed in claim 5, wherein the power semiconductor module comprises at least two submodules, and the two or more power semiconductor switches that are synchronously switchable by the drive signal are not all situated in the same submodule.

7. The electronic circuit as claimed in claim 1, wherein the circuit comprises at least 3 semiconductor switches.

* * * * *